United States Patent [19]

Perkins et al.

[11] Patent Number: 5,239,448

[45] Date of Patent: Aug. 24, 1993

[54] FORMULATION OF MULTICHIP MODULES

[75] Inventors: Charles T. Perkins; Gustav Schrottke, both of Austin, Tex.

[73] Assignee: International Business Machines Corporation, Armonk, N.Y.

[21] Appl. No.: 783,644

[22] Filed: Oct. 28, 1991

[51] Int. Cl.[5] .............................................. H05K 1/14
[52] U.S. Cl. ................................... 361/764; 174/266; 257/686; 257/778; 439/68; 439/91; 361/746; 361/762; 361/744
[58] Field of Search ............... 361/392, 396, 398, 400, 361/401, 410, 412, 414, 388; 174/255, 261, 262, 266; 257/686, 778, 723; 439/68, 66, 91

[56] References Cited

U.S. PATENT DOCUMENTS

| | | | |
|---|---|---|---|
| 4,064,552 | 12/1977 | Angelucci et al. | 301/414 |
| 4,081,898 | 4/1978 | Taylor, Jr. et al. | 29/622 |
| 4,104,728 | 8/1978 | Kasubuchi | 364/712 |
| 4,177,519 | 12/1979 | Kasabuchi et al. | 364/712 |
| 4,495,546 | 1/1985 | Nakamura et al. | 361/398 |
| 4,567,543 | 1/1986 | Miniet | 361/398 |
| 4,598,337 | 7/1986 | Wuthrich et al. | 361/401 |
| 4,672,152 | 6/1987 | Shinohara et al. | 174/68.5 |
| 4,744,008 | 5/1988 | Black et al. | 361/386 |
| 4,754,371 | 6/1988 | Nitta et al. | 361/411 |
| 4,843,520 | 6/1989 | Nakatani et al. | 361/395 |
| 4,926,241 | 5/1990 | Carey | 357/75 |
| 4,933,810 | 6/1990 | Cardashian et al. | 361/398 |
| 4,937,707 | 6/1990 | McBride et al. | 361/398 |
| 4,967,950 | 11/1990 | Legg et al. | 228/180.2 |
| 4,982,376 | 1/1991 | Megens et al. | 361/400 |
| 4,987,100 | 1/1991 | McBride et al. | 437/206 |
| 4,990,948 | 2/1991 | Sasaki et al. | 354/485 |
| 5,028,983 | 7/1991 | Bickford et al. | 357/69 |

FOREIGN PATENT DOCUMENTS 3307768 12/1988 Japan.

OTHER PUBLICATIONS

IBM TDB "Concept for Forming Multilayer Structure for Electronic Packaging," vol. 30, No. 3, Aug., 1987, pp. 1353-1356.

Primary Examiner—Leo P. Picard
Assistant Examiner—Young S. Whang
Attorney, Agent, or Firm—Mark E. McBurne

[57] ABSTRACT

A method of reducing the area of MCMs that are integral to a flexible carrier is provided. A locally complex area, i.e. multilayer MCM carrier is constructed on a flex carrier, along with other components to form a subsystem. The flex carrier provides the interface between the MCM and the system that is utilizing the function. Also, the flex carrier will receive non-complex portions of the function, e.g. low I/O devices, not required to be mounted on the complex area (MCM) of the subsystem. The locally complex functional area will contain the high performance DCA mounted components, such as custom ASICs, processors, high frequency analog parts and other high I/O chips. The MCM on flex is constructed by obtaining an appropriate flexible carrier, such as a dielectric material having electrically conductive signal lines circuitized on both sides. A photoimageable dielectric layer is then placed over the appropriate portion of the circuitized carrier and vias are formed therein and filled with electrically conductive material. The top side of the dielectric layer is then circuitized and electrically connected to the flex carrier wiring layers as required. Additional layers are then built as needed by an identical process. Electrically conductive pads are formed on the top circuitized dielectric layer in order to provide an interconnection point for the chip I/Os that will be directly attached thereto.

11 Claims, 6 Drawing Sheets

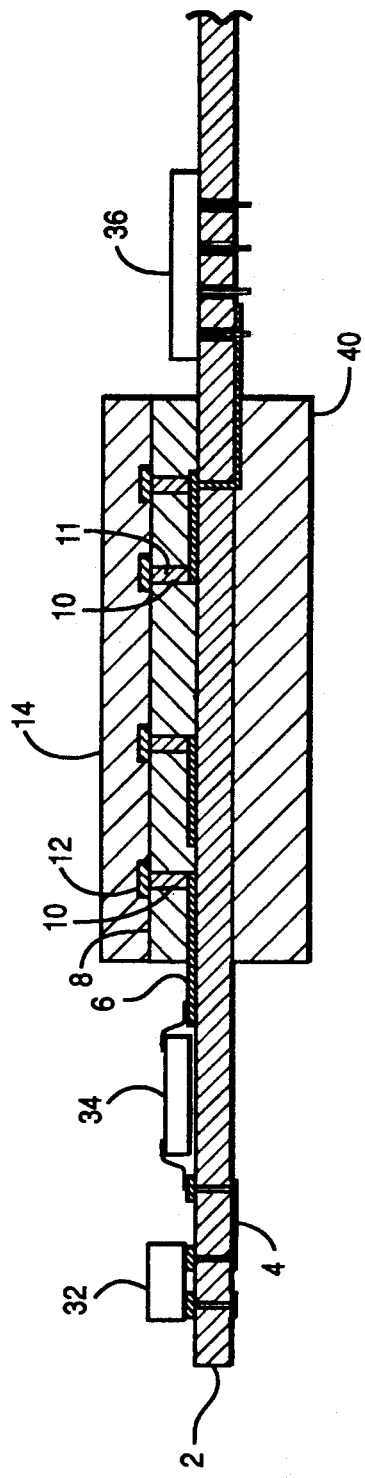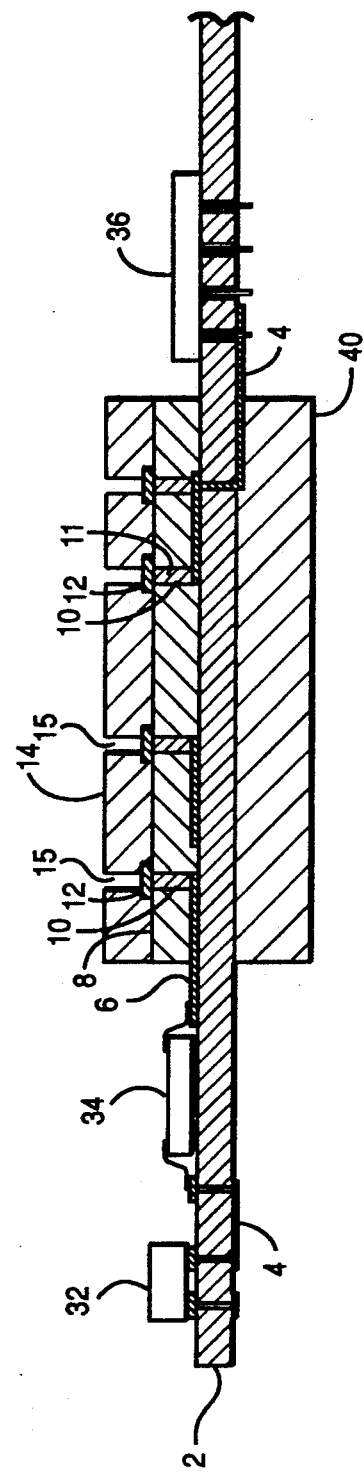

FORMULATION OF MULTICHIP MODULES

BACKGROUND OF THE INVENTION

1. Field of the Invention

The present invention relates generally to the fabrication of multichip modules having reduced dimensions and overall complexity. More specifically, modules capable of carrying multiple integrated circuit devices (hereinafter ICs or chips) are formed on a flexible carrier such that functional subsystems, i.e. complex areas of computer functions, such as memory, processors, graphics, SCSI adapters, I/O drivers, and the like can be placed on the flexible carrier.

2. Description of Related Art

It is currently known to attach many different configurations of chips to flexible carriers. For example U.S. Pat. No. 4,967,950 shows the attachment of a controlled collapse chip connection (C4) type of IC directly to a flexible substrate. Other configurations of chips can also be attached to flexible substrate material, including pin through hole (PTH) packages, wire bonding and surface mount technology (SMT) chips wherein leads are aligned on solder pads and the solder is then reflowed.

Further, conventional technology has the capability of packaging multiple chips in various package configurations on a flexible substrate to form complex areas, or islands that can be used to provide specific functions. U.S. Pat. No. 4,567,543 shows a double sided flexible module that can receive a plurality of SMT and PTH packages. U.S. Pat. No. 4,495,546 describes a flexible substrate with a plurality of chips thereon that can be inserted into a connection slit on a motherboard. U.S. Pat. No. 5,028,983 discloses a film having beam leads with one end extending outward from the film to contact a substrate, and the other end to be bonded to the contact pads of an IC. C4 type chips are shown attached to a flexible carrier by use of an interposer type arrangement in U.S. Pat. No. 4,987,100 and 4,937,707. IBM TDB "Concept for Forming Multilayer Structures for Electronic Packaging" describes placing chips onto a flexible film which is then folded back on itself with a heat spreader device disposed between the sides of the film.

It is also known to use the complex areas, created when plural interconnected chips are attached to flexible substrate, to provide various functions in different types of electronic devices. For example. U.S. Pat. No. 4,177,519 and 4,081,898 describe using a flexible carrier with electronic components thereon to manufacture calculators. Further, the manufacture of wrist watches using functional areas is shown by U.S. Pat. No. 4,598,337 and 4,064,552. A camera lens including a flexible printed circuit board with chips thereon is described by U.S. Pat. No. 4,990,948. U.S. Pat. No. 4,843,520 shows an electronic circuit module with electronic components attached to a flexible film that is attached to first and second substrates. U.S. Pat. No. 4,104,728 describes an electronic apparatus with a flexible substrate, having a wiring pattern formed thereon which is disposed in a housing.

It can be seen that flexible carriers with integrated circuit devices attached thereon to form flexible circuits is well known in the art. However, current demands on the computer industry require that more functionality be placed in a smaller area, which can be packaged more efficiently by a computer system designer. In order to provide more functionality. multichip modules (MCM) have been utilized wherein the modules are attached directly to a planar board, or a circuit card. This method has several drawbacks including the high cost of the carrier to which the MCM is attached (due to the complexity of the MCM I/Os) and problems with efficiently interconnecting the module input/outputs (I/Os). Another problem, shown in the related art is the area required to attach and interconnect chips which are mounted on flexible carrier. That is. "fan-out" is required whereby leads extend from the chip to the periphery of the MCM or flex substrate for interconnection between the chips and other electronic devices, or other levels of packaging.

Therefore, it can be seen that a means of efficiently providing a functional subsystem consisting of plural densely placed electronic devices for use in a computer would be very desirable.

SUMMARY OF THE INVENTION

In contrast to the prior art, the present invention provides a method of producing a functional subsystem in a computer that reduces the area of MCMs that are attached to flexible carriers. Correspondingly, additional space is made available on the system planar since the complex functional areas (MCMs) of the subsystem are attached to the system cabling.

The present invention includes a locally complex functional area, i.e. multilayer MCM carrier that is assembled on a flex carrier. Thus, the locally complex area is not required to be attached to an expensive planar, but is affixed to a flexible cable, i.e. a carrier, which is capable of supporting higher line density than standard printed circuit boards (PCB) and is therefore more cost effective. The flex carrier provides the interface to the MCM. as well as the interface to the system that is utilizing the function. The less complex region of the subsystem will also be on the flex carrier which will directly receive non-complex components of the function, i.e. low I/O chips, passive devices, or the like, not required to be mounted on the MCM. Whereas. the locally complex functional area, i.e. the MCM, will contain only the high performance direct chip attach (DCA) mounted components, such as custom ASICs (application specific integrated circuits), processors, high frequency analog parts and other high I/O chips. Thus, in this manner, the entire computer function is constructed and housed on the flexible carrier assembly.

The subsystem of the present invention, including the complex and non-complex areas, is constructed by obtaining an appropriate flexible carrier, such as a dielectric material having electrically conductive signal lines circuitized on at least one side thereof. Of course, the circuitized lines will match the type of MCM and function to be placed on the flex carrier. A photoimageable dielectric layer is then placed over the appropriate portion of the circuitized carrier and vias are formed therein and filled with electrically conductive material. The top side of the dielectric layer is circuitized to form electrical signal transmission lines interconnected to the flex carrier circuit lines as required. Additional layers are then built as needed by an identical process, as previously described. Electrically conductive pads are formed on the top circuit dielectric layer in order to provide an interconnection point for the chip I/Os that will be directly attached to the module.

In accordance with the previous summary, objects, features and advantages of the present invention will become apparent to one skilled in the art from the subsequent description and the appended claims taken in conjunction with the accompanying drawings.

BRIEF DESCRIPTION OF THE DRAWINGS

FIG. 8 illustrates a second dielectric placed on the circuit layer of the first layer in accordance with the present invention;

FIG. 9 shows vias formed in the second dielectric layer;

DETAILED DESCRIPTION OF THE PREFERRED EMBODIMENTS

Figure 1:
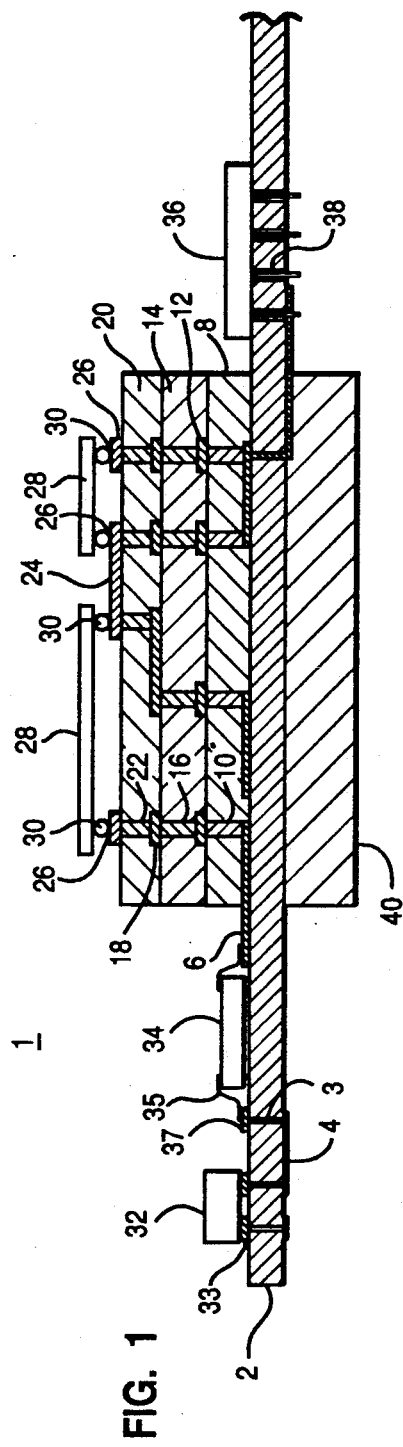
FIG. 1 is crossectional view of the subsystem of the present invention showing a representative locally complex functional area and a non-complex area.

Referring to FIG. 1, the multichip module and flexible carrier (subsystem) of the present invention is shown and generally noted by reference numeral 1. A flexible substrate 2 is provided which will be electrically configured depending upon the complexity of the function to be placed thereon. For example, a flex cable having one or two circuitized layers thereon can be used, as well as a flex carrier that provides fine circuitized lines, full or partial ground planes, and controlled impedance circuitry or strip lines for high performance networks. In a preferred embodiment of the present invention, the flex carrier 2 will be fabricated from a single flexible layer of dielectric material such as polyimide, or the like. Additionally, the flex carrier 2 will include layers of electrically conductive material disposed on each side of the dielectric layer. Circuitization of the electrically conductive layers disposed on the flex carrier 2 will also be provided and dependent upon the type of complex functional area being constructed. These circuit layers on the flex carrier 2 will consist of electrically conductive material such as copper or aluminum added onto the dielectric material by plating conductor lines on a conductive seed layer, or by covering the entire surface of the dielectric layer of carrier 2 with metal and then removing the unwanted material by etching, or other processes, to leave the conductive signal lines and other circuits thereon. Thus, personalized (specific to the complex function being packaged) circuit layers 4 and 6 are formed on carrier 2 and are shown in FIG. 1, along with vias 3 and 38 which allow for interconnection between the circuit layers 4 and 6, as well as providing interconnection between non-complex components, directly attached to flex carrier 2 (e.g. low I/O ICs) and other devices such as chips to be attached to the complex area of subsystem 1. Thus, it can be seen that flex carrier 2 can provide two of the wiring layers (4,6) which may be required by the locally complex area (MCM) of subsystem 1, thereby decreasing the number of wiring layers that must subsequently be added during construction of the locally complex area, as described in FIGS. 4-13. A stiffener 40 is shown and used to provide a rigid base for construction of the present invention, and can be used to provide thermal enhancement and thermal expansion matching control for the module 1 during both assembly and operation. Stiffener 40 is typically constructed of a ceramic or silicon material. The stiffener 40 will reduce the stresses involved due to mismatched thermal coefficients of expansion between the carrier 2 and the chips on the multichip module 1, i.e. the complex area. However, there are many applications in which the difference in thermal coefficients of expansion between the module 1 and the carrier 2 are insignificant and the stiffener 40 will be used only during manufacture of the present invention and removed upon completion of the present invention.

The first dielectric layer 8 is shown attached to carrier 2 on the side opposite of stiffener 40. Dielectric layer 8 includes vias 10 which provide access to by subsequent circuit layers and chip I/Os to circuit layer 6 of carrier 2. Circuit layer 6 will include input/output interconnection points that must be accessed by integrated circuit devices subsequently placed on top of the multichip module. Electrically conductive material is placed in vias 10 (FIG. 6) such that electrical connection can be made from a circuit layer 12 disposed on the side of dielectric layer 8 opposite carrier 2. Another dielectric layer 14 is shown and disposed adjacent circuit layer 12 that includes vias 16 with electrically conductive material disposed therein allowing connection between subsequent circuit layers or chip I/Os and circuit layer 12 of dielectric layer 8. Another layer 18 is circuitized and provided on the side of dielectric layer 14 opposite carrier 2. Dielectric layer 20 and subsequently formed vias 22 are shown adjacent circuit layer 18 and stacked vertically on top of dielectric layer 14. Again, electrically conductive material is placed in vias 22 to provide interconnection from another personalized circuit layer 24 placed on a side of layer 20 opposite carrier 2. The number of layers of dielectric material and circuit layers is determined by the complexity of the subsystem, i.e. how much wiring is required to connect the chips to each other and the other circuitry required for the subsystem. Electrical connection means 26 are provided on dielectric layer 20 and in communication with circuit layer 24 to provide electrical bonding with solder ball interconnect points 30, such as a C4 solder ball, of integrated circuit devices 28. In this manner, chips 28 are electrically interconnected through each of the dielectric layers 8, 14, 20 and wiring layers 12, 18, 24 to carrier 2 and any other electronic components requiring interconnection. Further, chip I/Os 30 are capable of being vertically aligned with the corresponding I/O interconnection points of the flex carrier layers 4,6 in order to reduce the area of the locally complex area (MCM) of subsystem 1 by eliminating the need for fan-out. Thus, fan-out used in conventional MCMs to provide wiring to other components and subsystems is eliminated by using direct chip attach (DCA) technology to attach chips to a flex mounted module.

In a preferred embodiment of the present inventions DCA is used to attach the chips face down, as in the case of C4 attachment. Further, for high I/O chips, area array footprints are also contemplated by the present invention. A patent application entitled "Inverted Bump Chip Connection," assigned to the assignee- of the present invention, having U.S. Ser. No. 07/771695, and filed on Oct. 4, 1991, hereby incorporated by reference, describes various methods of interconnecting differently configured chips on a single substrate. In particular, it is shown how differently configured chips may be mounted face down, whether originally cofigured to use C4 technology, or other types of attachment, such as wire bonding. Chips mounted face down are preferred since the smallest possible "footprint" of the chips is presented and hence the area required for the complex region is minimized. It should be noted that it is possible to wire bond the chips, but with an increased area being required for attachment.

FIG. 1 also shows non-complex elements 32, 34 and 36 which are placed directly on the non-complex area of flexible carrier 2, thereby reducing the required size and complexity of the locally complex area (MCM) that must be formed on flexible substrate 2. For example, device 32 may be a capacitor, or the like and is shown as being interconnected to flexible carrier 2 by surface mount technology (SMT) methods. Pads 33 have been formed on carrier 2 and corresponding electrical connection pads on device 32 are aligned therewith and joining metallurgy, e.g. solder, is then reflowed. Device 34 is shown attached to the flex carrier 2 by wire bonding techniques, wherein an electrical conductor 35 is placed from an I/O on chip 34 to an electrical connection pad 37 on carrier 2. Further, a pin through hole (PTH) device 36 is shown which is connected to the flexible carrier by vias 38 that have conductive material plated around the inside surface thereof and are formed in flex carrier 2. Subsequent to placement of device 36 on carrier 2, compatible metallurgy is reflowed to connect the I/Os (pins) of device 36 with flex circuit layer 4.

Figure 2:
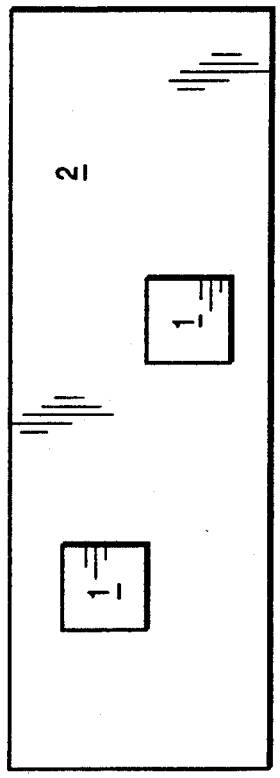
FIG. 2 is a plan view of a flexible carrier having plural complex functional areas thereon.

Referring to FIG. 2, a plan view is shown of flexible substrate 2 having multiple complex functional areas 1 located thereon. Thus, it can be seen that many, if not all, of the computer functions traditionally placed on printed circuit boards can be affixed to flexible carrier 2, or the like.

Figure 3:
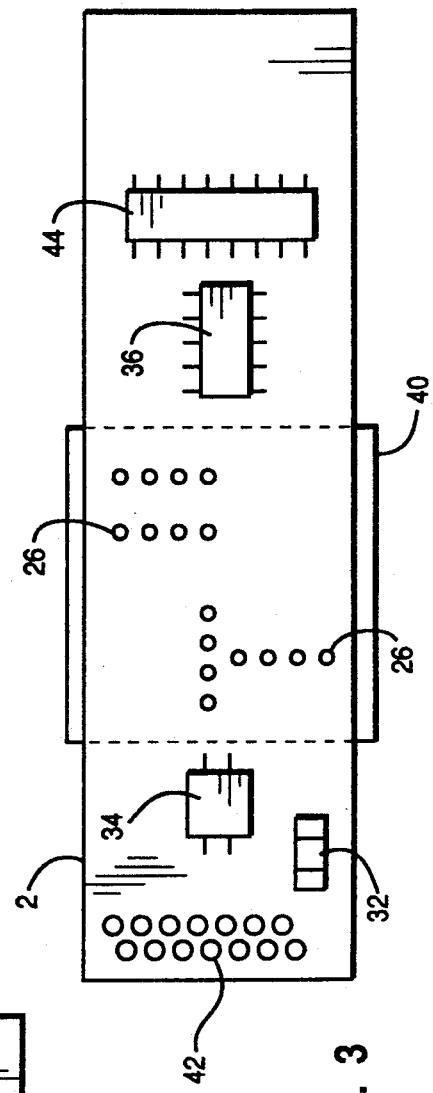
FIG. 3 is a schematic representation of a plan view of complex and non-complex areas with representative individual components shown.

FIG. 3 shows a plan view of a single complex functional area. Again, flexible carrier 2 is shown and includes non-complex electronic components 32, 34, 36, 44, shown attached thereto such as low I/O integrated circuit devices and passive devices such as capacitors and resistors. Interconnection means 42 are shown disposed on flexible carrier 2 which allow for carrier 2 to be interconnected With an I/O connector, or the like mounted within a computer system. The interconnection points 42, including pads, are used to electrically connect the flexible carrier to a printed circuit board, or the like. Again, stiffener 40 is shown which may be included in the present invention depending on the thermal characteristic of the chips and material utilized. Interconnection points 26 are shown on the surface of the top layer of the complex area. Interconnection points 26 include electrically conductive pads that are compatible for joining the type of I/O interconnection points of the chip to be placed on the locally complex functional area 1. Of course, the I/Os 26 are electrically connected, through the previously described wiring layers, to non-complex devices 32, 34, 36, 44, carrier interconnection points 42, or one another, as shown in FIG. 1 and as required for the computer function being packaged.

Figure 4:
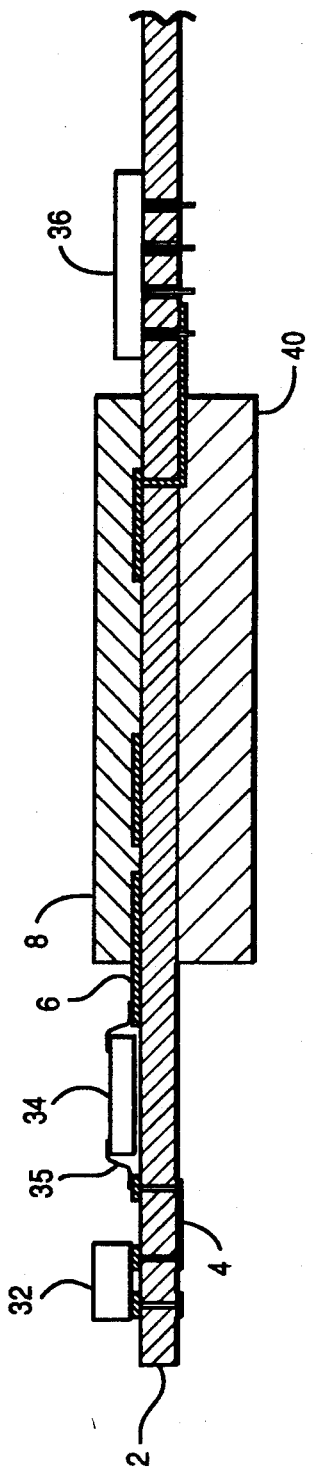
FIG. 4 is a crossectional view of the initial step of placing a dielectric layer on a flex carrier in accordance with the present invention.

FIGS. 4-13 will now be used to describe a method of fabricating the present invention, as shown in FIG. 1. Referring to FIG. 4, flexible carrier 2 is shown with circuit layers 4 and 6 disposed on opposite sides thereof. Dielectric layer 8 is shown after having been placed on carrier 2 adjacent circuit layer 6 and opposite stiffener 40. Dielectric layer 8 consists of a photoimageable polyimide, or the like and is placed on carrier 2 by conventional means such as hot roll lamination, or the like. It should be noted, that passive devices 32, 34, 36 may have been placed on carrier 2 by a previous process, or attached to the flexible carrier 2 subsequent to the completion of the locally complex functional area of the present invention. Passive elements 32, 34, 36 are represented on each of FIGS. 4-13, but it should be understood that they may be affixed to carrier 2 prior to, or after the fabrication process for the locally complex area of subsystem 1.

Figure 5:
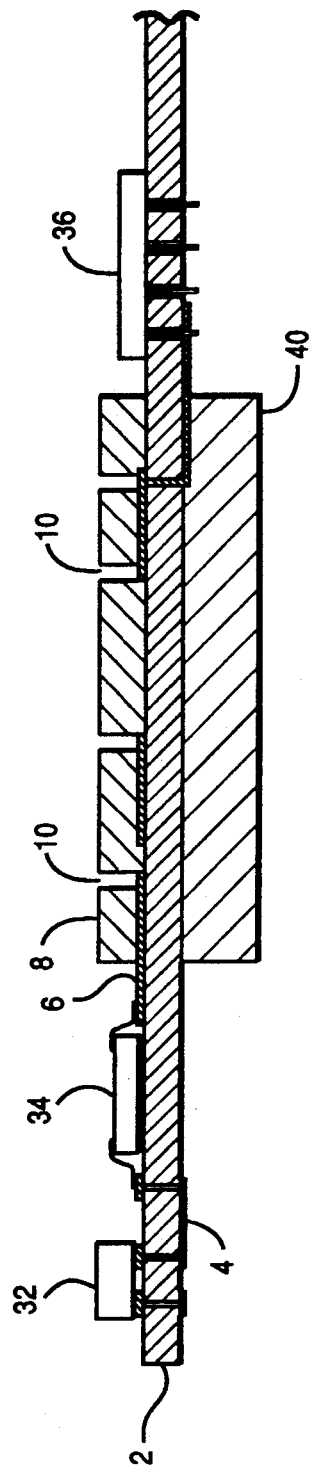
FIG. 5 shows forming vias in the dielectric layer placed on the flex carrier in FIG. 4.
Figure 6:
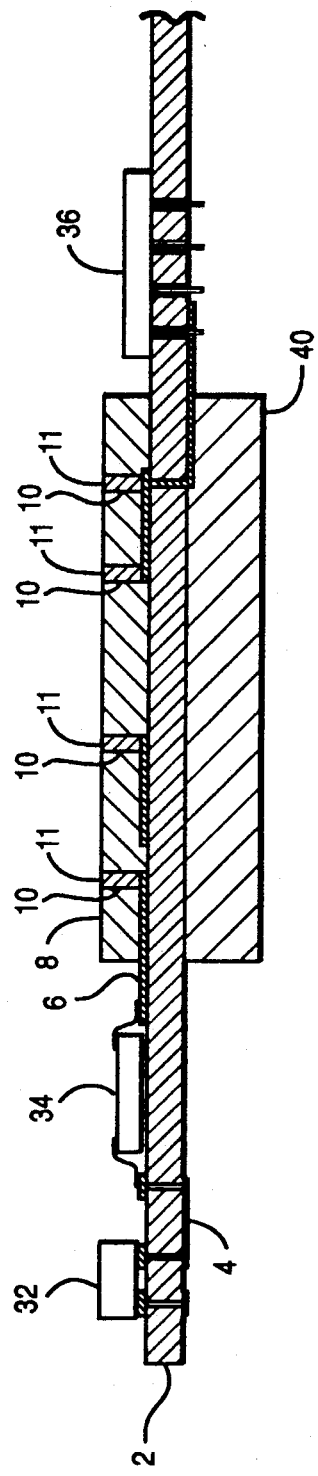
FIG. 6 is another crossectional view illustrating the placement of electrically conductive material in the vias.

In FIG. 5, vias 10 are formed in dielectric layer 8 by any one of a number of conventional methods including etching, laser ablation techniques, or the like. In the preferred embodiment, a mask is placed on top of dielectric layer 8 which is then exposed to actinic radiation, thereby removing the exposed portion of the dielectric layer 8 and forming vias 10. FIG. 6 illustrates electrically conductive material 11 disposed within vias 10. In a preferred embodiment, conductive material 11 is electrodeposited, or plated into vias 10. Other methods such as squeeging, and the like can be used to place electrically conductive material within vias 10.

Figure 7:
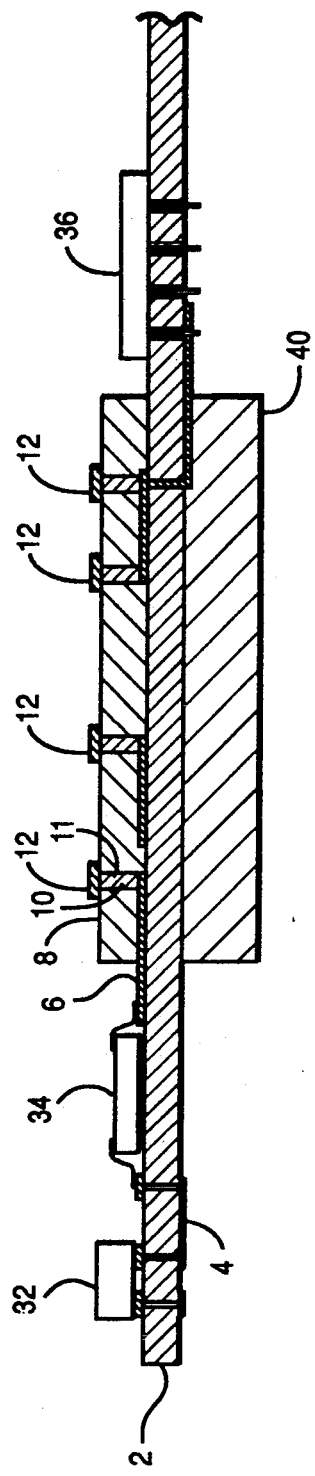
FIG. 7 shows the circuitization layer formed on the top surface of the dielectric layer.

FIG. 7 shows a personalized circuit layer 12 of conductive material, e.g. copper or aluminum, formed on top of dielectric layer 8. This circuit layer 12 consists of a plurality of electrical signal transmission lines and allows subsequently attached ICs to be in communication with one another and other elements in the computer, e.g. other subsystems. A conductive seed layer of material is sputtered or otherwise placed onto the top of dielectric layer 8 to provide a base for plating conductor lines of aluminum, copper or the like onto layer 8. Additional methods of placing circuit layer 12 onto dielectric layer 8 include covering the entire surface of layer 8 with conductive metal and removing all of the metal except the desired conductive lines by etching. It should be noted that the sequence of the steps shown in FIGS. 5-7 can be interchanged. For example, personalized circuit layer 12 may first be applied to layer 8 by methods as previously described. Subsequently, vias 10 may be formed through circuit layer 12 and dielectric 8, e.g. by etching, and conductive material 11 then added to vias 10. Thus, it can be seen that the methodology used to fabricate the present invention is not limited to the sequence of steps represented in the drawings. Further, those skilled in the art will understand that the lines of the circuit layer 12 can be formed at the same time vias 10 are filled with conductive material. For example, the step of sputtering a conductive seed layer of material can be used to fill the vias, and provide the base for subsequent plating of the circuit lines of layer 12. Additionally, the vias 10 can be filled with conductive material during the step of covering the entire surface of layer 8 with conductive material, prior to removing all of the conductive material except that required for the transmission lines of layer 12.

Further, once the initial layer of dielectric material 8 and its corresponding circuit layer 12 are placed on carrier 2, the electrically conductive material 11 effectively completes the electrical connection of the flexible carrier 2 to the multichip module 1. Thus, interconnection points to flex carrier 2 are now provided at the top surface of the initial dielectric layer 8 of the multichip module. Also, it can be seen how the circuit layers 4, 6 of the flex carrier 2 may form the first two circuit layers of the locally complex area, e.g. layer 12 could be considered as the third wiring layer of subsystem 1.

Figure 10:
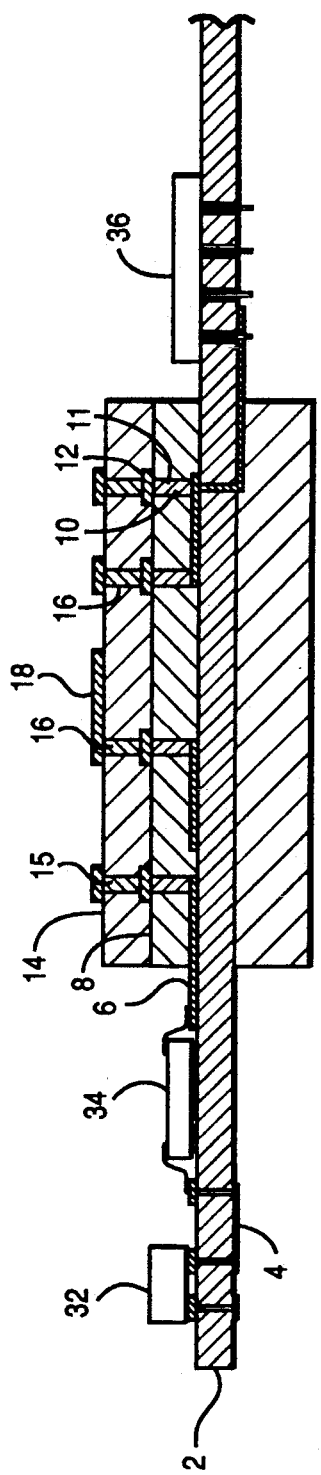
FIG. 10 is another crossection showing the second layer circuitized and with electrically conductive material placed in the vias.
Figure 11:
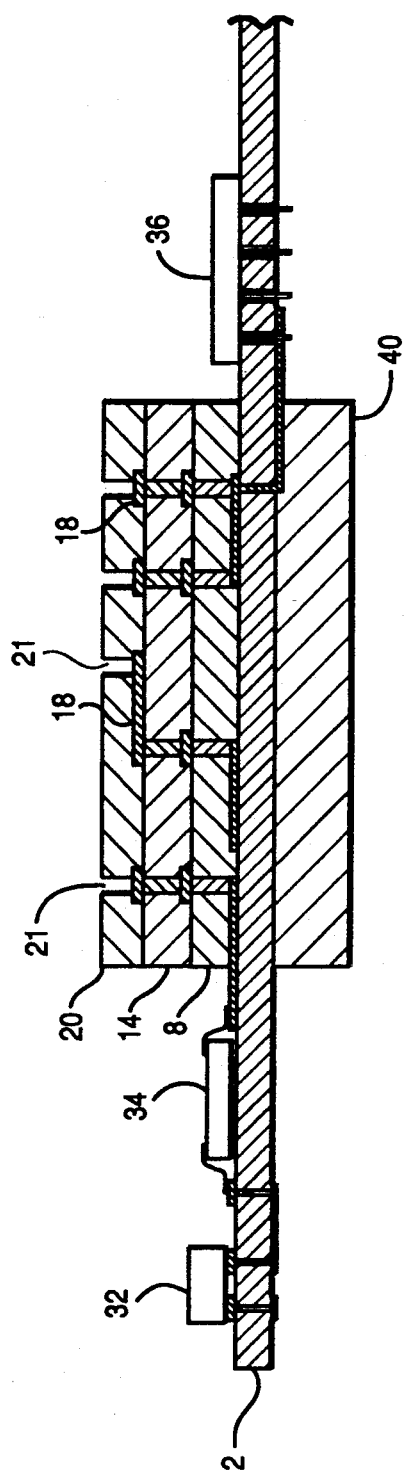
FIG. 11 shows a third dielectric layer, placed on the second layer, having vias formed therein.

Referring to FIG. 8, a second dielectric layer 14 is then applied to the top surface of layer 8 and corresponding circuit layer 12, by means such as laminating, or the like. Vias 15 may then be formed, as shown in FIG. 9, in dielectric layer 14 to provide a conductive path to the circuit layer 12. In FIG. 10, electrically conductive material 16 is shown disposed within vias 15 and another personalized circuit layer 18 of electrical transmission lines is disposed on the surface of dielectric layer 14 opposite layer 8. Again, the steps in the sequence of forming vias 15, placing circuit layer 18 on dielectric 14 and providing electrically conductive material 16 within vias 15 are interchangeable and combinable, as previously described. FIG. 11 shows a third dielectric layer 20 placed on top of dielectric layer 14 with vias 21 formed therein corresponding to the interconnection points of circuit layer 18. As previously described, layer 20 may be laminated to the surface of layer 14 and circuit 18, and vias 21 may be formed in layer 20 by means of etching, laser ablation, photoimaging, or the like. The number of layers built up in this manner is determined by the wiring density required to interconnect the chips with one another and to the flexible carrier 2.

Figure 12:
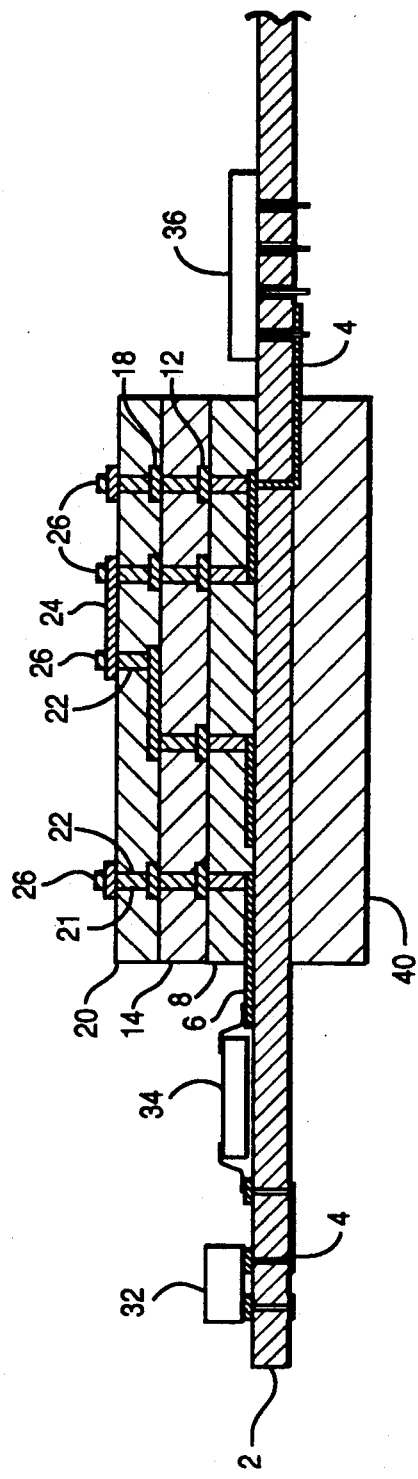
FIG. 12 illustrates the circuitization of the third dielectric layer and placement of electrically conductive material in the vias.

FIG. 12 shows a circuit layer 24 placed on dielectric layer 20 by means as previously described, and electrically conductive material 22 disposed within vias 21. Thus, it can be seen that personalized circuit layer 24, disposed on the top surface of dielectric layer 20 is electrically connected with circuit layer 6 of flexible carrier 2 through vias 10, 18 and 22.

In order for an integrated circuit device 28 to be mounted on the complex functional area compatible joining material must be placed intermediate circuit layer 24 and the I/O interconnection points 30 of the chips. Interconnection points 26 include electrically conductive joining material for interfacing the chip I/Os 30, e.g solder balls, with circuit layer 24. Joining material 26 may include solder pads or projections, as well as electrically conductive epoxy, paste, or the like. The type of I/O interconnection point 26 placed on the complex area is dependent on the type of chip, or chips required to provide the function supplied by the complex area, as previously described with reference to the patent application incorporated herein.

Figure 13:
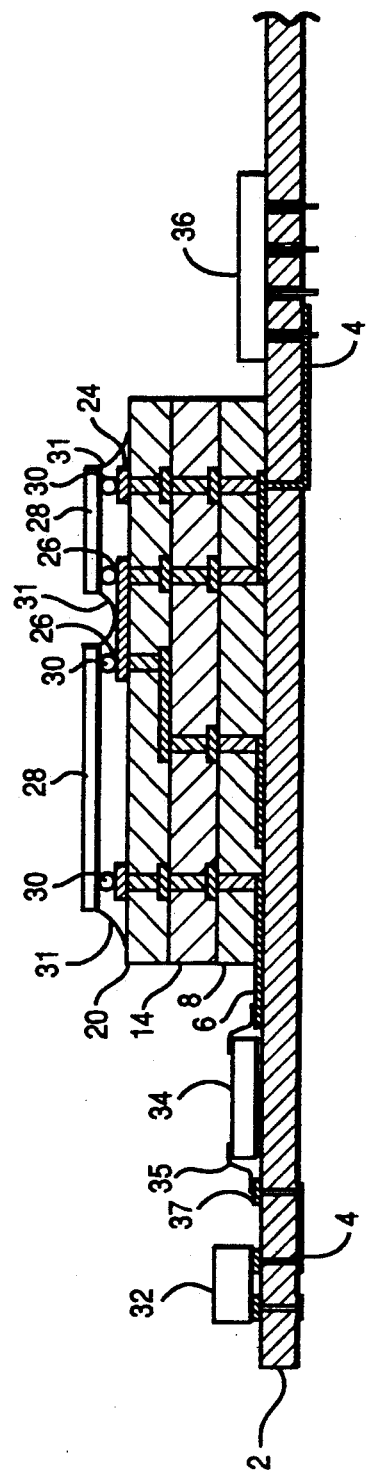
FIG. 13 shows the completed subsystem having chips attached to the third dielectric layer of the complex area.

FIG. 13 shows the completed multichip module 1 having integrated circuit devices 28 attached to circuit layer 24 via joining means 26. The ICs 28 may be vertically aligned and in electrical communication with corresponding I/O interconnection points of circuit layer 6 of flex carrier 2. Thus, it can be seen how the present invention reduces the amount of area required for multiple chips to be affixed to a flexible carrier. Stiffener 40 has been removed since the manufacturing process is completed and stiffener 40 may, or may not be required due to the thermal expansion characteristics of the components.

Protection for the chips 28 and connection pads may be provided by encapsulating chip 28 with a suitable material, such as an encapsulating epoxy. This encapsulation 31 will also relieve the stress on the chip I/O joints caused by difference in thermal expansion between the chip 28 and the corresponding dielectric layer, such as layer 20 (FIG. 13) and will allow removal of the stiffener 40.

Once again referring to FIG. 2, it should be noted that it is possible to process the construction of multiple complex areas in parallel on single flexible substrate carrier 2 in order to reduce cost and maximize efficiency of the manufacturing process.

Therefore, the present invention as shown and described is a means of packaging an entire computer function as a single unit, or subsystem that includes complex and non-complex areas. These functions may include graphics capabilities, microprocessors, input-/output devices, such as a keyboard, display, mouse controllers, and the like. Efficiency of the computer system is increased due to the minimal interconnection distances between integrated circuit devices. In this manner, entire computer subsystems can be efficiently manufactured and packaged, in a minimized area, on a flexible substrate, such that a computer system developer can more efficiently design new systems.

Although certain preferred embodiments have been shown and described, it should be understood that many changes and modifications may be made therein without departing from the scope of the appended claims.

What is claimed is:

1. A subsystem, packaged on a flexible carrier, for providing function in a computer system, comprising:
    a flexible dielectric carrier having circuitized lines with plural I/O interconnection points formed on at least one side thereof;
    at least one layer of dielectric material, adjacent said circuitized lines, having at least one via formed therein to electrically expose said I/O interconnection points of said flexible carrier; and
    at least one IC device, disposed on a top one of said at least one dielectric layer, such that I/O interconnection points of said IC are vertically aligned and electrically interconnected with corresponding ones of said flexible carrier I/O interconnection points.

2. The subsystem according to claim 1 wherein said at least one via comprises a substantially cylindrical hole within said dielectric layer having electrically conductive material therein.

3. The subsystem according to claim 2 further comprising circuitized electrically conductive transmission lines on a surface of said at least one dielectric layer opposite said flexible carrier.

4. The subsystem according to claim 3 further comprising:
    a plurality of said dielectric layers in vertical alignment with one another and adjacent said circuitized lines of said flexible carrier;

vias in each of the vertically aligned dielectric layers; and circuitized electrical transmission lines on a surface of each of said dielectric layers opposite said flexible carrier.

5. The subsystem according to claim 4 wherein said circuitized transmission lines formed on each of said dielectric layers are in electrical communication with one another through said vias.

6. The subsystem according to claim 5 comprising IC interconnection points, in electrical communication with circuitized lines on a top one of said dielectric layers, for allowing the attachment of at least one IC device thereto.

7. The subsystem according to claim 6 wherein a lamination bonding material is disposed intermediate each of said layers of dielectric material.

8. The subsystem according to claim 1 further comprising non-complex elements of said subsystem affixed directly to said flexible carrier.

9. The subsystem according to claim 1 wherein a plurality of said subsystems are provided on a single said flexible dielectric carrier.

10. The subsystem according to claim 1 further comprising a stiffener, disposed adjacent said flexible carrier on a side opposite said at least one dielectric layer, for providing stability during manufacture of said subsystem, and minimizing the effects of thermal expansion between said IC devices and said flexible carrier.

11. The subsystem according to claim 1 wherein circuitized lines are disposed on both sides of said flexible carrier, thereby forming a first and a second wiring layer of said subsystem.

* * * * *